(12) United States Patent
Slager

(10) Patent No.: US 8,080,730 B2
(45) Date of Patent: *Dec. 20, 2011

(54) PHOTOVOLTAIC DEVICE

(75) Inventor: Ben Slager, Rhenen (NL)

(73) Assignee: SolarExcel B.V., Rhenen (NL)

( * ) Notice: Subject to any disclaimer, the term of this patent is extended or adjusted under 35 U.S.C. 154(b) by 0 days.

This patent is subject to a terminal disclaimer.

(21) Appl. No.: 12/921,628

(22) PCT Filed: Mar. 4, 2009

(86) PCT No.: PCT/EP2009/052548
§ 371 (c)(1),
(2), (4) Date: Sep. 9, 2010

(87) PCT Pub. No.: WO2009/112406
PCT Pub. Date: Sep. 17, 2009

(65) Prior Publication Data
US 2011/0005593 A1     Jan. 13, 2011

(30) Foreign Application Priority Data
Mar. 10, 2008 (EP) ..................... 08102455

(51) Int. Cl.
*H02N 6/00* (2006.01)
*H01L 31/042* (2006.01)
*H01L 31/00* (2006.01)

(52) U.S. Cl. ........ 136/256; 136/247; 136/258; 136/259; 438/57

(58) Field of Classification Search ............. 136/256, 136/247, 258, 259; 438/57
See application file for complete search history.

(56) References Cited

U.S. PATENT DOCUMENTS

| | | | |
|---|---|---|---|
| 3,912,931 A | 10/1975 | Gravisse et al. | |
| 4,153,813 A * | 5/1979 | Blieden et al. | 136/247 |
| 4,200,472 A * | 4/1980 | Chappell et al. | 136/246 |
| 4,202,704 A | 5/1980 | Hodgson et al. | |
| 4,413,157 A * | 11/1983 | Ames | 136/248 |
| 4,427,839 A | 1/1984 | Hall | |
| 4,576,850 A | 3/1986 | Martens | |
| 4,626,613 A | 12/1986 | Wenham et al. | |
| 4,629,821 A | 12/1986 | Bronstein et al. | |
| 5,702,538 A | 12/1997 | Endros et al. | |
| 2004/0086716 A1 | 5/2004 | Weikinger | |

(Continued)

FOREIGN PATENT DOCUMENTS

CA    2 508 740 A1    6/2004

(Continued)

OTHER PUBLICATIONS

Dictionary.com, Definition of Apex, <http://dictionary.reference.com/browse/apex>, accessed Feb. 24, 2011.*

(Continued)

*Primary Examiner* — Basia Ridley
*Assistant Examiner* — Allison Bourke
(74) *Attorney, Agent, or Firm* — Oliff & Berridge, PLC

(57) ABSTRACT

A photovoltaic device including an active layer of an amorphous material in which the active layer is in the shape of an array of defined and repeating geometrical structures, wherein the geometrical structures include a base and a single apex that are connected by at least three n-polygonal surfaces where n is equal to 4 or higher.

15 Claims, 3 Drawing Sheets

U.S. PATENT DOCUMENTS

| | | |
|---|---|---|
| 2004/0175192 A1 | 9/2004 | Tsukuda et al. |
| 2005/0039788 A1* | 2/2005 | Blieske et al. ............... 136/246 |
| 2006/0172119 A1 | 8/2006 | Hayashi et al. |
| 2007/0204902 A1* | 9/2007 | Dutta ........................... 136/256 |
| 2009/0071531 A1* | 3/2009 | Dame ........................... 136/251 |

FOREIGN PATENT DOCUMENTS

| | | |
|---|---|---|
| CH | 693 771 A5 | 1/2004 |
| DE | 29 24 045 A1 | 12/1980 |
| DE | 42 01 126 A1 | 6/1992 |
| DE | 199 54 954 A1 | 5/2001 |
| EP | 0 012 217 A2 | 6/1980 |
| JP | 57-152172 A | 9/1982 |
| JP | 10-163513 A | 6/1998 |
| JP | 2004-297025 A | 10/2004 |
| WO | WO 97/19473 A1 | 5/1997 |
| WO | WO 03/046617 A1 | 6/2003 |
| WO | WO 2009/059998 | 5/2009 |

OTHER PUBLICATIONS

International Search Report for International Application No. PCT/EP2008/064996, mailed Jan. 19, 2009.

International Preliminary Report on Patentability for International Application No. PCT/EP2008/064996, mailed Feb. 11, 2010.

Written Opinion of the International Searching Authority for International Application No. PCT/EP2008/064996, mailed Jan. 19, 2009.

International Search Report for International Patent Application No. PCT/EP2009/057495, mailed Sep. 28, 2009.

Written Opinion for International Patent Application No. PCT/EP2009/057495, mailed Sep. 28, 2009.

International Preliminary Report on Patentability for International Patent Application No. PCT/EP2009/057495, mailed Oct. 15, 2010.

Maruyama et al., "Transformations of the wavelength of the light incident upon solar cells;" *Solar Energy Materials & Solar Cells*; vol. 69; (2001); pp. 207-216.

Shalav et al., "Luminescent layers for enhanced silicon solar cell performance: Up-conversion;" *Solar Energy Materials & Solar Cells*; vol. 91; (2007); pp. 829-842.

Zhao et al., "22.7% Efficient Silicon Photovoltaic Modules with Textured Front Surface;" *IEEE Transactions on Electron Devices*; vol. 46; No. 7; Jul. 1999; pp. 1495-1497.

U.S. Appl. No. 13/000,894, filed Dec. 22, 2010.

U.S. Appl. No. 12/734,420, filed Apr. 30, 2010.

G.A. Landis, A Light-Trapping Solar Cell Coverglass, *21st IEEE Photovoltaic Specialist Conference*, pp. 1304-1307 (1990).

U. Blieske et al., Light-Trapping in Solar Modules Using Extra-White Textured Glass, *3rd World Conference on Photovoltaic Energy Conversion*, pp. 188-191, May 18, 2003.

H.J. Hovel et al., the Effect of Fluorescent Wavelength Shifting on Solar Cell Spectral Response, *Solar Energy Materials*, 2, pp. 19-29, Apr. 24, 1979.

E. Manea et al., Optimization of Front Surface Texturing Processes for High-Efficiency Silicon Solar Cells, *Solar Energy Materials and Solar Cells*, Elsevier Science Publishers, Amsterdam, NL, pp. 423-431, May 1, 2005.

M. Green et al., Recent Progress in Silicon Solar Cells, *Optoelectronic and Microelectronic Materials Devices*. Proceeding S. 1998 Conference in Perth, Australia, pp. 1-6, Dec. 14, 1998.

International Search Report for PCT/EP2009/052548, dated Apr. 14, 2009.

International Preliminary Report on Patentability for PCT/EP2009/052548, dated May 31, 2010.

* cited by examiner a)

Randomly textured front electrode →
Active layer →
Back electrode → b)

Structured transparent layer →
Front electrode →
Active layer →
Back electrode → a)     b)     c)

a)

b)

c)

PHOTOVOLTAIC DEVICE

This application is a U.S. National Phase Application of PCT/EP2009/052548 filed Mar. 4, 2009, which claims priority to European Patent Application 08102455.6, filed Mar. 10, 2008. The disclosure of each of these applications is hereby incorporated by reference in its entirety.

BACKGROUND

The invention pertains to a photovoltaic device of the thin film type comprising a supporting substrate and an active layer. The invention further pertains to a process for producing a photovoltaic device comprising a supporting substrate and an active layer of an amorphous material.

Photovoltaic devices are commonly used to convert light energy into electrical energy. Photovoltaic devices contain an active layer which consists of a light absorbing material which generates charge carriers upon light exposure. An active layer which is currently common in photovoltaic devices is silicon (Si). However, a variety of materials can be encountered like for example gallium arsenide (GaAs), cadmium telluride (CdTe) or copper indium gallium diselenide (CIGS). The charges, which are generated in the active layer, are separated to conductive contacts that will transmit electricity. Due to the thin and brittle nature of the active layer it is usually protected from external influences by a transparent cover plate e.g. made of glass. It is known from prior art that both the active layer and the cover plate reflect a part of the light incident to the photovoltaic device. Especially the high refractive index of the active layer causes large reflection losses which can—in the case of silicon—be up to 30% of the incident light. Since the reflected light can not be converted into electrical energy these reflection losses cause a large reduction in the efficiency of a photovoltaic device.

In order to reduce these reflection losses, an anti reflection coating can be applied on top of the light absorbing material or so called active layer. An anti reflection coating consists of a single quarter-wave layer of a transparant material with a refractive index which is between the refractive index of the active layer and the cover plate. Although this theoretically gives zero reflectance at the center wavelength and decreased reflectance for wavelengths in a broad band around the center, the processing and material costs of these layers are relativly high. Also the processing techniques to create the coatings (e.g. chemical vapour deposition) are very complex, elaborate and time consuming.

It is known from the art that a surface structure on the light receiving side of the cover layer can be used to reduce the reflection losses of the the cover plate. Here, V-shaped (G. A. Landis, 21$^{st}$ IEEE photovoltaic specialist conference, 1304-1307 (1990)) or pyramidal structures as disclosed in WO 03/046617 are applied to the light receiving side of a cover plate made of glass to reduce the reflection losses of said plate and hence increase its transmission. CH 693 771 A5 discloses cone structures and pyramidal structures with triangular surfaces applied to both sides of the cover layer to reduce the reflection losses of said plate and hence increase its transmission. The structures are applied on both surfaces of the cover layer to prevent negative consequences of upside down installation of the cover layer. The structures can be applied to the glass plate via for example casting or pressing. However, when using the plate as a cover plate of a photovoltaic device the maximum efficiency of said device can only be increased by 6%, which is a reduction of approximatly 30% of the reflection losses, according to a model study (U. Blieske et all, 3$^{rd}$ World Conference on Photovoltaic Energy Conversion, 188-191 (2003)). In practice the results are even less and only 3% can be obtained. Although the structures reduce some of the reflection losses of the active layer, it reduces predomenantly the reflection losses of the cover plate. Hence the total reduction in reflection losses, and increase in efficiency of the photovoltaic device, is low.

A better method to reduce the reflection losses of the active layer via texturing the light receiving surface side of the cover plate is given in non-published European Patent Application EP07 021 458. Here an array of surface relief structures is applied to the cover plate that is in optical contact with the active layer. A single structure of said array is characterized by a base and a single apex and is connected by at least three n-polygonal surfaces where n is equal to 4 or higher. This specific design reduces not only the reflection losses of the glass cover but also to a great extent the reflection losses of the active layer underneath the cover plate. Although this method gives a cost-effective and efficient anti-reflection coating, the relief structures, located at the outside of the photovoltaic device, are sensitive to fouling.

Another method to reduce the reflection losses is to structure the surface of the active layer. This can be done by direct structuring of the material itself. Several processes, as for example sandblasting, milling, anionic oxidations, sputter etching, are known to create these structures. U.S. Pat. No. 4,626,613 discloses a laser assisted process for direct structuring of the active layer. U.S. Pat. No. 5,702,538 discloses photolithographic texturing for direct structuring of the active layer. JP 10163513 A discloses direct etching of the active layer with an etchant. By structuring the active layer, with pyramids, V-shapes, cubical shapes or random structures, a reduction in the reflection losses at active layer is obtained by multiple reflection at the surface offering the light a greater opportunity to enter the panel. Light falling within the grooved area, if it is not initially absorbed by the active layer, will be reflected onto another surface of the groove thereby increasing absorbtion. This effect reduces the reflection losses at the surface of the active layer and is therfore often referred to as an anti-reflection effect. Secondly, the structures may in some cases partially trap the light which is not absorbed by the active layer and reflected by surface of the substrate. As a result the chance of light absorption by the active layer is increased. Although structuring of the active layer can significantly improve the efficiency of a photovoltaic cell, production methods are very complicated, toxic and extremly expensive.

An alternative to direct structuring of the active layer is surface structuring of the substrate i.e. the cover layer on which the active layer is subsequently deposited. This method can be employed for thin film solar cells which use e.g. an active layer such as amorphous silicon. In said case the solar cells are manufactured by applying respectively the front electrode, active layer and back electrode on top of the transparent cover plate. In order to reduce the reflection losses of the active layer the front electrode is randomly textured via wet etching prior to depositing of the active layer.

Instead of a randomly textured surface, surface structuring of the cover layer can also be carried out such that the cover layer receives a defined and repeating surface structure on which the active layer is subsequently deposited. DE 4 201 126 pertains a photovoltaic device with a semiconductor thin film component for electric energy conversion. The active layer i.e. the semiconductor thin film component may be amorphous Silicon. The cover plate of the device has on its rear surface, i.e. the surface on which the active layer is deposited, a defined and repeating surface structure in the shape of a sawtooth formation thus leading to a sawtooth formation of the active layer. The effect of the sawtooth formation is a multiple internal reflection of unabsorbed light.

From the above it can be concluded that several techniques exist to reduce the reflection losses of a photovoltaic device. These techniques comprise structuring of the active layer or applying an anti-reflection coating on top of said layer. They are, however, complex and expensive. Alternatively, an additional transparent structured layer can be applied to the active layer or the cover plate. Although these techniques are cost effective, their performance is less efficient.

SUMMARY

It is therefore an object of the present invention to improve the efficiency of a photovoltaic device by enhancing to solar-energy absorbing property of its active layer and to provide a photovoltaic device in which the reflection losses of the active layer are further reduced.

This object is achieved by a photovoltaic device of the thin film type comprising an active layer in which the active layer is in the shape of an array of defined and repeating geometrical structures, characterized in that the geometrical structures comprise a base and a single apex which are connected by at least three n-polygonal surfaces where n is equal to 4 or higher.

DETAILED DESCRIPTION

Figure 1:
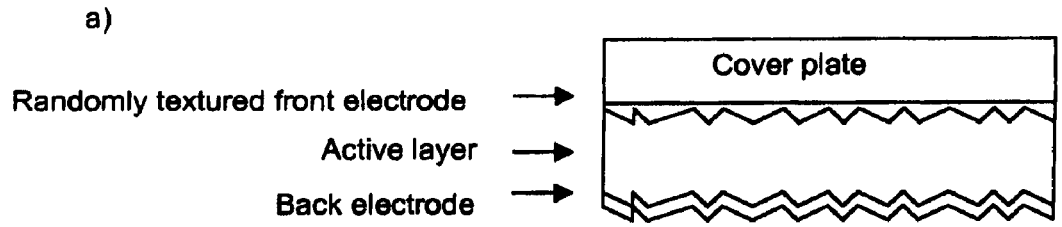
FIG. 1: Schematic representation of thin film photovoltaic device known from prior art with
  a) an active layer having a random structure and
  b) an active layer having v-shaped grooves
Figure 1:
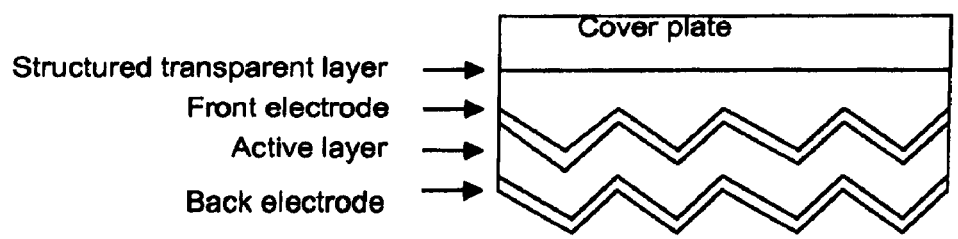

The apex is defined as the upper part of an individual geometrical optical relief structure. The apex is a single most distant point of an individual geometrical optical relief structure contrasting with the base. The apex is that point of which the distance to the base is the longest, measured in a straight line perpendicular to the base.

Thin film photovoltaic device is defined as being any photovoltaic device of which the active layer is deposited on a supporting substrate. The active layer of a thin film material according to the invention can be any layer which by itself, or in combination with any other layer, creates charges carriers upon exposure to light. Such materials can for example be cadmium telluride (CdTe), Copper-Indium Selenide (CIS), Gallium Arsenide (GaAs), copper indium gallium diselenide (GIGS), Copper indium diselenide (CID), nanocrystalline silicon, microcrystalline silicon, light absorbing dyes such as a ruthenium metalorganic dye or polymers and small-molecule compounds like polyphenylene vinylene, copper phthalocyanine and carbon fullerenes. Preferably the active layer according the invention contains an amorphous material. More preferably the active layer contains amorphous Silicon.

Although the active layer could contain only one individual geometrical structure it is preferred that the active layer contains an array of defined and repeating geometrical structures, i.e. a relief structure. An array is to be understood as collection or group of elements, in this case individual geometrical structures, placed adjacent to each other or arranged in rows and columns. Preferably the array contains at least 4 geometrical relief structures.

Preferably the base of each geometrical structure is of an m-sided polygonal shape and each geometrical structure contains at least m+1 surfaces in which the base is not considered to be one of those surfaces.

When describing the n-polygonal base of the relief structure by a circle wherein the edges of the polygonal base lie on the circumferential line of the circle, the diameter D of the circle is preferably less than 30 mm, more preferably less than 10 mm and most preferably less than 3 mm.

The height of structures depends on the diameter D of the base and is preferably between 0.1*D and 2*D.

In a preferred embodiment of the invention, the active layer contains an array of defined and repeating geometrical structures with adjacent geometrical structures abutting each other. The structures can be placed such that the orientation of all structures is the same, alternating or random with respect to each other.

These given requirements for a relief structure according to the present invention are not fulfilled in the case of a V-shaped, pyramid, cubical or totally random structures. The array of geometrical structures according to the invention is different from any relief structures in the active layer of a photovoltaic device known from prior art, i.e. from any V-shaped, pyramid, cubical or random structures. A V-shaped structure contains, when considered to be infinitely long, per definition only parallel surfaces. A V-shaped structure of finite length has a 4-sided polygonal base and 2 other surfaces along the length of the groove. A pyramid structure contains per definition m triangles which connect the m-polygonal base to the apex. A cubical structure does not contain a single apex when one of the surfaces of the cubical structure is the base. When the cubical structure is tilted on one of its corners to have a single apex, the cubical structure can not exhibit a surface which defines the base. These geometrical structures fulfill neither of the requirements according to the invention.

Surprisingly it could be shown that the active layer in the shape of an array of defined and repeating geometrical structures, characterized in that the geometrical structures comprise a base and a single apex which are connected by at least three n-polygonal surfaces where n is equal to 4 or higher enhances the solar-energy absorbing property of the active layer and therefore improves the efficiency of the photovoltaic device.

An array of geometrical structures according to the invention should be on at least one of the two main surface sides of the active layer. In a preferred embodiment of the invention the array of geometrical structures is present on the two main surface sides of the active layer. The surfaces on the outer rim of the active layer are not subject to surface structuring.

In a preferred embodiment of the invention the photovoltaic device comprises a supporting substrate with two main surface sides, which are parallel to the general plane of the active layers, characterized in that the shape of the surface side adjacent to the active layer is in the shape of the active layer or the inverse shape of the active layer. An inverse shape is to be understood as a shape corresponding to the original shape or matching the original shape. In case a bottom up strategy is chosen for building the photovoltaic device, the supporting substrate on which the active layer is deposited is used as a back plate at the non light receiving side of the photovoltaic device. In this case the structures should be preferably in the same shape of the geometrical structures desired on the light receiving side of the active layer.

In case a top down strategy is chosen for building the photovoltaic device according to the invention, a transparent cover plate is used as the supporting substrate at the light receiving side of the photovoltaic device. In this case the structures should be preferably in the inverse shape of geometrical structures desired in the active layer.

In another preferred embodiment of the invention the photovoltaic device therefore comprises a transparent cover plate with two main surface sides, a light receiving side and a surface side adjacent to the active layer, characterized in that the shape of the surface side adjacent to the active layer is inverse to the shape of the active layer. An inverse shape is to be understood as a shape corresponding to the original shape or matching the original shape.

Apart from the two main surface sides the transparent cover plate has surfaces on its outer rim that are not subject to structuring, e.g. in case of a rectangular plate four lateral surfaces A transparent material is to be understood as a material which has a linear absorption of less than 0.2 $mm^{-1}$ within the range of 400-1200 nm.

The transparent cover plate containing the geometrical structures inverse to the shape of the active layer can be made of any transparent materials that are known to one skilled in the art. Examples are polymers such as e.g. polycarbonate (PC), polymethylmethacrylate (PMMA), polyethylene terephthalate (PET), polyethylene (PE), polypropylene (PP), polyethyleneoxide (PEO), polyvinylchloride (PVC), polystyrene (PS), polyacrylamide (PAA), polyvinylalcohol (PVA), polyaramide (PA), polyvinylfluoride (PVF), polytetrafluoroethylene (PTFE), polyvinylacetate (PVAc), or ethylvinylacetate (EVA) or inorganic materials such as glass or any combination thereof.

The transparent cover plate of the photovoltaic device according to the invention having two main surface sides, a light receiving side and a surface side adjacent to the active layer is preferably characterized in that also the light receiving surface side comprises an array of defined and repeating geometrical structures. These defined and repeating geometrical structures on the light receiving surface side of transparent cover may be V-shaped grooves or pyramidal structures. More preferably the geometrical structures on the light receiving surface side of the transparent cover layer comprise a base and a single apex which is connected by at least three n-polygonal surfaces where n is equal to 4 or higher.

The efficiency of the photovoltaic device can be further improved if a luminescent dye is present in the transparent cover plate containing the geometrical structures inverse to the shape of the active layer.

Said luminescent dyes improve the spectral response of the photovoltaic device by converting wavelengths which are not efficiently used by said layer to wavelengths which are more efficiently used.

Part of the light emitted by the luminescent molecules of the luminescent dye can however not be used by the active layer of prior art photovoltaic devices because it is reflected by said layer. As a result luminescent dyes can in practice only increase the efficiency of prior art photovoltaic devices by approximately 2% (H. J. Hovel et all, *Solar energy materials*, 2, 19-29 (1979)).

When combining a photovoltaic device according to the present invention with luminescent dyes known in the art, surprisingly a synergistic effect occurs in which the spectral response of a photovoltaic device is improved beyond what would be expected from the simple addition of luminescent molecules of the luminescent dye.

When adding luminescent molecules to the transparent cover plate containing the geometrical structures inverse to the shape of the active layer according to the invention, the spectral response of the photovoltaic device is improved compared to a non structured surface. The transparent cover plate comprising the structures increases the absorption of light emitted by the luminescent molecules at the light receiving surface of the active layer of the photovoltaic device by reducing the reflection losses of luminescent light. The luminescent molecules are preferably distributed inside the plate, but can also be present in a separate layer between the transparent cover plate which contains the array of geometrical structures and the light receiving surface of the active layer of the photovoltaic device.

The luminescent molecules which may be used can for example be fluorescent or phosphorescent and said molecules can be both down-conversion luminescent and up-conversion luminescent. The preferred molecules are fluorescent and can for example be any perelyne, coumarin, rhodamine, naphthalimide, benzoxanthene, acridine, auramine, benzanthrone, cyanine, stilbene, rubrene, leciferin or derivatives thereof.

The luminescent dye containing the luminescent molecules is thus preferably an organic dye. The luminescent dye may, however, also be an inorganic dye. Preferably the luminescent dye acts as an UV absorber to stabilize the polymer building the transparent cover plate.

The luminescent dye may comprise a mixture of several luminescent dyes. The concentration of the luminescent dye preferably lies between 0.001 and 50 gram dye per $m^2$ cover plate surface and per mm cover plate thickness.

The active layer in the shape of an array of geometrical structures may be manufactured by applying the amorphous material which the active layer contains to a plate or layer with the inverse structure that is desired for the active layer. The active layer can be applied via different methods as for example: pouring, sputtercoating, chemical enhanced vapor deposition, plasma enhanced chemical vapor deposition or physical vapor deposition.

In some embodiments of the invention at least one additional feature and/or layer can be present between the active layer and the relieved plate. This layer can for example be a release layer, a conductive layer, an anti reflection layer, conductive tracks, anti fouling layer or anti fogging layer.

In a preferred process for producing the photovoltaic device according to the invention the plate or layer with the inverse structure of the active layer can be used as a cover plate for the photovoltaic device provided that it is made of a transparent material. In this embodiment the active layer is not removed in a subsequent step. Such a process for producing a photovoltaic device in which the active layer is in the shape of an array of defined and repeating geometrical structures, comprises the steps of providing a transparent cover plate with two main surface sides, a light receiving surface side and a surface side to which an active layer will be applied, shaping the surface side to which an active layer will be applied into a shape inverse to the defined and repeating geometrical structures of the active layer and applying the active layer onto this surface side of the transparent cover plate, characterized in that the geometrical structures comprise a base and a single apex which are connected by at least three n-polygonal surfaces where n is equal to 4 or higher.

FIG. 1 shows a schematic representation of prior art thin film photovoltaic devices with a structured active layer. In order to reduce the reflection losses of the active layer the front electrode may be randomly textured as shown in FIG. 1 *a*). Instead of a randomly textured surface, surface structuring of the active layer can also be carried out such that the cover layer receives a defined and repeating surface structure on which the active layer is subsequently deposited. Such a photovoltaic device is shown in FIG. 1 b) with an active layer having v-shaped grooves.

Figure 2:
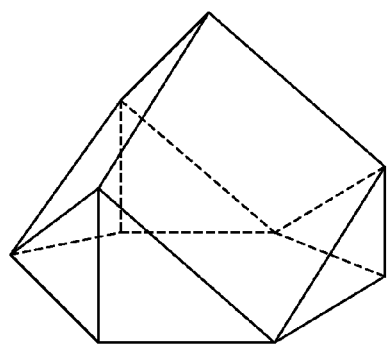
FIG. 2: Perspective view of an individual geometrical structure according to the invention

FIG. 2 shows an example for an individual geometrical structure according to the invention in perspective view. This example, however, is not meant to limit the scope of the invention. Here the geometrical structure contains 3 square surfaces which directly connect the hexagonal base to a single apex and the structure contains 9 other surfaces in total. This structure is different from any geometrical structures in the active layer of a photovoltaic device known from prior art such as V-shaped, pyramid or random structures. A V-shaped structure has a 4-sided polygonal base and 4 other surfaces, i.e. 2 along the length of the groove and 2 at the edge. A V-shaped structure contains, when considered to be infinitely long, per definition only parallel surfaces. A pyramid structure contains per definition m triangles which connect the m-polygonal base to the apex. The structure described in FIG. 2 fulfills neither of these requirements.

Figure 3:
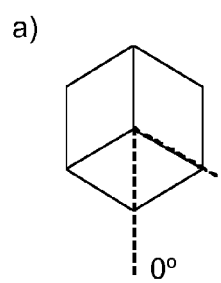
FIG. 3: *a*), top view *b*), side view 0° *c*), side view 60° of an individual geometrical structure
Figure 3:
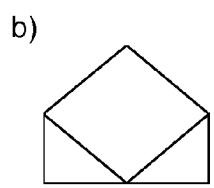
Figure 3:
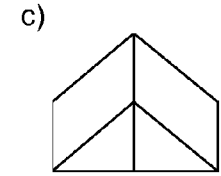

FIG. 3 shows the individual geometrical structure of FIG. 2 in a) top view, b) side view 0° and c) side view 60°.

Figure 4:
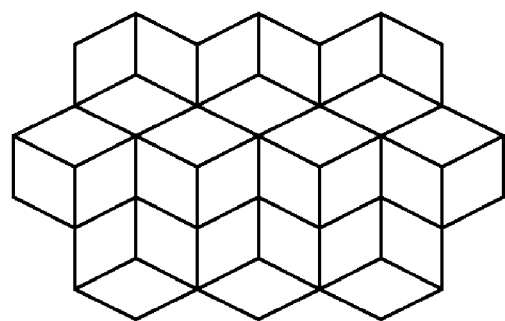
FIG. 4: *a, b, c*—Schematic representation showing a part of an array of geometrical optical relief structures with adjacent structures abutting each other
Figure 4:
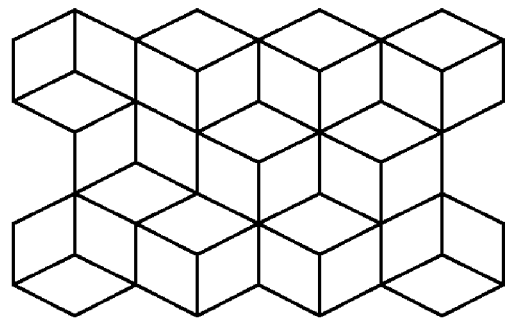
Figure 4:
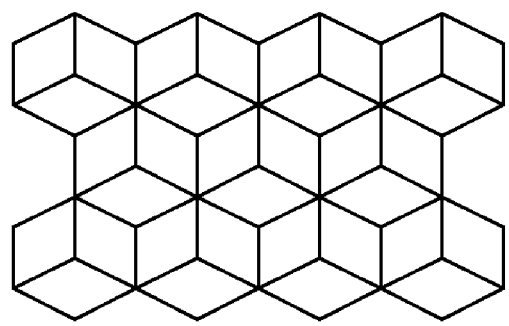

In a preferred embodiment of the invention, the active layer contains an array of geometrical structures. FIG. 4 is a schematic representation of an active layer showing a part of an array of geometrical structures with adjacent structures abutting each other in top view. FIG. 4 a shows the active layer with the geometrical structures arranged such that the orientation of all structures is the same with respect to each other. FIG. 4 b shows the geometrical structures arranged such that the orientation of the structures is alternating with respect to each other. FIG. 4 c shows the geometrical structures arranged such that the orientation of all structures is random with respect to each other. In order for the reflection losses of the active layer to be further reduced the apexes of the individual geometrical structures may protrude from the active layer or they may point inwards into the active layer.

To elucidate, but not to limit the extent of the invention examples are given in the following:

Comparative Example 1

A raytrace study was performed in which the reflection losses were simulated with an essentially even active layer that underwent no surface structuring process.

The simulated active layer consisted of a thin layer which has the optical properties of silicon (n=4.295 at $\lambda$=500 nm, absorption coefficient 889/mm).

The reflection losses of light from the active layer were simulated by placing a light source above the simulated active layer. The light source emitted a total of 1000 rays with a total intensity 1000 W and a wavelength of 500 nm.

The reflection losses are determined by comparing the intensity of the incident light and the amount of light absorbed by the active layer. The amount of reflected light is calculated from the difference between the incident and the absorbed light. In the table below the reflection losses are given in the case the light emitted by the light source is collimated or has Lambertian distribution.

From the results, which are plotted in the table below, it can be observed that a significant amount of light is reflected and it can thus be concluded that the efficiency of a photovoltaic device comprising a non-structured active layer is significantly reduced by the reflection losses from this layer.

Comparative Example 2

A raytrace study was performed in which the reflection losses were simulated with a V-groove structured active layer known from prior art. The setup of the simulation was similar to comparative example 1.

The simulated active layer consisted of a thin layer which has the optical properties of silicon (n=4.295 at $\lambda$=500 nm, absorption coefficient 889/mm). The geometry of a single structure of the array of V grooves consists of base with length/width ratio of 20 and has top angle of 90°. The array consisted of 10 single structures.

From the results, which are plotted in the table below, it can be observed that a V groove structuring of the active layer reduces the reflection losses of said layer.

Comparative Example 3

A raytrace study was performed in which the reflection losses of an inverted pyramid structured layer known from prior art were simulated. The setup of the simulation was similar to comparative example 1.

The simulated active layer consisted of a thin layer which has the optical properties of silicon (n=4.295 at $\lambda$=500 nm, absorption coefficient 889/mm). The geometry of a single structure of the array inverted pyramid structured layer consists of base with length/width ratio of 1 and has top angle of 90°. The array consisted of 10×10 single structures.

From the results, which are plotted in the table below, it can be observed that an inverted pyramid structured layer reduces the reflection losses of said layer.

Example 1

A raytrace study was performed in which the reflection losses of an active layer are simulated, that is in the shape of an array of defined and repeating geometrical structures according to the invention.

The simulated active layer consisted of a thin layer which has the optical properties of silicon (n=4.295 at $\lambda$=500 nm, absorption coefficient 889/mm). The geometry of a single structure of the array of defined and repeating geometrical structures in which the active layer was shaped was equal to the geometry described in FIGS. 2 and 3. The array consisted of 15×15 single structures and was formed according to FIG. 4c.

The reflection losses of light from the active layer were simulated by placing a light source above the simulated active layer. The light source emitted a total of 1000 rays with a total intensity 1000 W and a wavelength of 500 nm.

The reflection losses are determined by comparing the intensity of the incident light and the amount of light absorbed by the active layer. The amount of reflected light is calculated from the difference between the incident and the absorbed light. In the table below the reflection losses are given in the case the light emitted by the light source is collimated or has Lambertian distribution.

When comparing these results, which are given in the table below, with the results from comparative example 1, 2 and 3, it can concluded that an active layer which structured according to the invention has the lowest reflection losses. A photovoltaic devices based on this principle will therefore have an improved efficiency.

TABLE 1

Results of the raytrace study

| Shape of active layer | Reflection losses when lightsource collimated [%] | Reflection losses when lightsource has Lambertian distribution [%] |
| --- | --- | --- |
| Non-structured layer | 39% | 39% |
| V-groove layer | 15% | 29% |
| Inverted pyramid layer | 15% | 29% |
| Invention structured layer | 6% | 24% |

The invention claimed is:

1. A photovoltaic device of the thin film type, comprising an active layer that is in a shape of an array of defined and repeating geometrical structures,
wherein each geometrical structure comprises a base and a single point apex, the single point apex and the base being connected by at least three n-polygonal surfaces, wherein n represents the number of sides of each polygonal surface and is equal to 4 or higher.

2. A photovoltaic device according to claim 1, wherein the base of each geometrical structure is an m-sided polygonal shape and each geometrical structure comprises at least m+1 surfaces.

3. A photovoltaic device according to claim 1, wherein the array is comprised of defined and repeating geometrical structures with adjacent geometrical structures abutting each other.

4. A photovoltaic device according to claim 1, wherein the array is comprised of geometrical optical relief structures that have a same orientation, an alternating orientation or a random orientation with respect to each other.

5. A photovoltaic device according to claim 1, wherein the active layer comprises an amorphous material.

6. A photovoltaic device according to claim 1, wherein the active layer comprises amorphous silicon.

7. A photovoltaic device according to claim 1, wherein the photovoltaic device further comprises a supporting substrate for the active layer, the supporting substrate having two main surface sides, which are parallel to a general plane of the active layer, and a shape of the surface side adjacent to the active layer is in the shape or in an inverse shape of the active layer.

8. A photovoltaic device according to claim 7, wherein the supporting substrate for the active layer is a transparent cover plate, the transparent cover plate having the two main surface sides, a light receiving side and a surface side adjacent to the active layer, and the shape of the surface side adjacent to the active layer is the inverse shape of the active layer.

9. A photovoltaic device according to claim 8, wherein a luminescent dye is present in the transparent cover plate.

10. A photovoltaic device according to claim 8, wherein the light receiving surface side comprises the array of defined and repeating geometrical structures.

11. A photovoltaic device according to claim 10, wherein each geometrical structure on the light receiving surface side comprises the base and the single point apex.

12. A photovoltaic device according to claim 1, wherein in the array, the geometrical structures are arranged such that the base of each geometrical structure is on a single common plane.

13. A method for producing a photovoltaic device of the thin-film type in which an active layer is in a shape of an array of defined and repeating geometrical structures, the method comprising:
providing a supporting substrate with two main surface sides,
shaping a surface side of the two main surface sides of the supporting substrate into a shape or into an inverse shape of the defined and repeating geometrical structures of the active layer, and
applying the active layer onto the surface side of supporting substrate, wherein each geometrical structure comprises a base and a single point apex, the single point apex and the base being connected by at least three n-polygonal surfaces, wherein n represents the number of sides of each polygonal surface and is equal to 4 or higher, wherein the two main surface sides of the supporting substrate are parallel to a general plane of the active layer.

14. A method for producing a photovoltaic device according to claim 13, wherein the active layer is applied by physical or chemical vapor deposition.

15. A method for producing a photovoltaic device according to claim 13, wherein the photovoltaic device comprises a transparent cover plate and the transparent cover plate is the supporting substrate for the active layer.

* * * * *